(12) United States Patent
Chang et al.

(10) Patent No.: US 9,153,675 B2
(45) Date of Patent: Oct. 6, 2015

(54) POWER SEMICONDUCTOR AND MANUFACTURING METHOD THEREOF

(71) Applicant: MOSEL VITALEC INC., Hsinchu (TW)

(72) Inventors: Chien-Ping Chang, Hsinchu (TW);
Chien-Chung Chu, Hsinchu (TW);
I-Hsien Tang, Hsinchu (TW);
Chon-Shin Jou, Hsinchu (TW);
Mao-Song Tseng, Hsinchu (TW);
Shin-Chi Lai, Hsinchu (TW)

(73) Assignee: MOSEL VITALEC INC., Hsinchu (TW)

( * ) Notice: Subject to any disclaimer, the term of this patent is extended or adjusted under 35 U.S.C. 154(b) by 0 days.

(21) Appl. No.: 13/974,158

(22) Filed: Aug. 23, 2013

(65) Prior Publication Data

US 2014/0327038 A1  Nov. 6, 2014

(30) Foreign Application Priority Data

May 6, 2013  (TW) .............................. 102116015 A

(51) Int. Cl.
| | | |
|---|---|---|
| *H01L 29/00* | (2006.01) | |
| *H01L 21/00* | (2006.01) | |
| *H01L 29/739* | (2006.01) | |
| *H01L 29/66* | (2006.01) | |

(52) U.S. Cl.
CPC ...... *H01L 29/7395* (2013.01); *H01L 29/66333* (2013.01); *H01L 29/7397* (2013.01)

(58) Field of Classification Search
CPC ..................... H01L 29/7813; H01L 29/66734; H01L 29/42368; H01L 29/4236; H01L 29/66348; H01L 29/7393; H01L 29/7395; H01L 29/7397; H01L 29/66325; H01L 29/66333

See application file for complete search history.

(56) References Cited

U.S. PATENT DOCUMENTS

| | | | |
|---|---|---|---|
| 2002/0048855 A1* | 4/2002 | Matsudai et al. ............. | 438/135 |
| 2002/0081784 A1* | 6/2002 | Kobayashi et al. ........... | 438/137 |
| 2006/0006459 A1* | 1/2006 | Yoshikawa .................... | 257/330 |
| 2007/0004098 A1* | 1/2007 | Kazama et al. ............... | 438/141 |
| 2008/0164517 A1* | 7/2008 | Ohta et al. .................... | 257/330 |

* cited by examiner

*Primary Examiner* — Victor A Mandala
*Assistant Examiner* — Quovaunda V Jefferson
(74) *Attorney, Agent, or Firm* — Kirton McConkie; Evan R. Witt

(57) ABSTRACT

A power semiconductor includes a semiconductor substrate, a metal oxide semiconductor layer, a N-type buffer layer and a P-type injection layer. The semiconductor substrate has a first surface and a second surface. The metal oxide semiconductor layer is formed on the first surface for defining a N-type drift layer of the semiconductor substrate. The N-type buffer layer is formed on the second surface through ion implanting, and the P-type injection layer is formed on the N-type buffer layer through ion implanting. By utilizing the semiconductor substrate having drift layer and forming the N-type buffer layer and the P-type injection layer on the second surface of the semiconductor substrate through ion implanting, the ion concentration is adjustable. As a result, the electron hole injection efficiency and the width of depletion region are easily adjusted, the fabricating processes are simplified, and the fabricating time and cost are reduced.

5 Claims, 7 Drawing Sheets

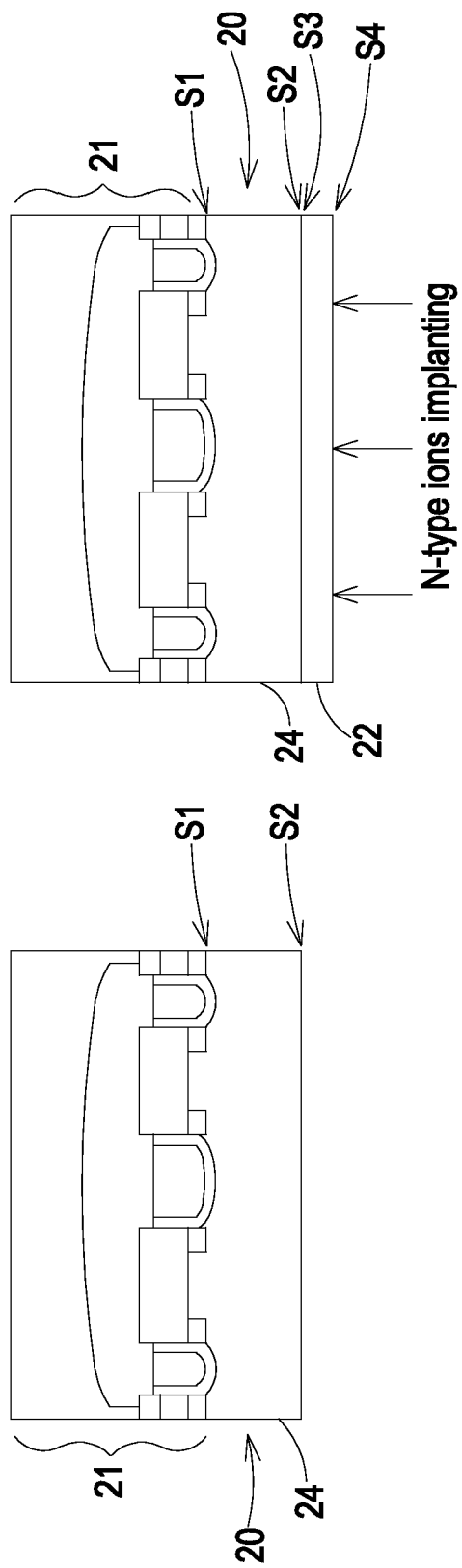

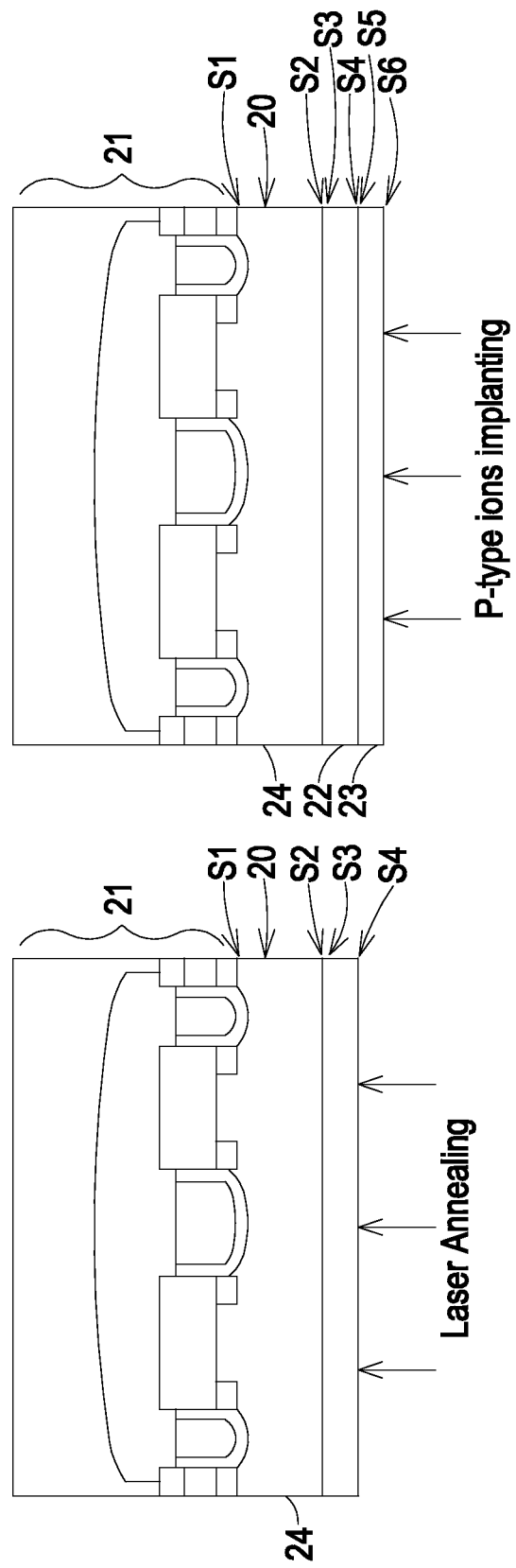

POWER SEMICONDUCTOR AND MANUFACTURING METHOD THEREOF

FIELD OF THE INVENTION

The present invention relates to a power semiconductor, and more particularly to a power semiconductor having a specially designed metal oxide semiconductor layer, which can increase the carrier concentration of the conduction region, and a manufacturing method thereof.

BACKGROUND OF THE INVENTION

In recent years, with the growing of the technologies, lot types of electronic products are produced. The high-tech electronic devices are deeply combined with human's daily life. For example, each of the panels and the global positioning systems of automobiles, smart phones, tablet PCs, variety toys and remote-controlled apparatuses is part of the technology life of human nowadays. The mainly necessary elements in electronic devices are semiconductor elements, such like power semiconductors, transistors, amplifiers and switches, especially the power semiconductors are much more fabricated in industry.

For example, one of the common power semiconductors is an insulated gate bipolar transistor (hereinafter "IGBT"). The basic encapsulation of an IGBT is a power semiconductor with three terminals. The characteristics of IGBTs include high efficiency and high switching speed. Generally, IGBTs are developed to replace the bipolar junction transistors (or called BJTs). IGBTs have both the characteristics of field effect transistors (or called FET) and bipolar transistors, so the IGBTs can withstand high current load, the gate can be easily driven and the turn-on voltage drop is low. Under this circumstance, the common uses of IGBTs are applied to high-capacity power devices like switching power supplies, motor controllers and induction cookers.

Nevertheless, even though IGBTs have been fabricated and used for tens of years, there are still some drawbacks of the process technology and semiconductor structure. Please refer to FIG. 1. FIG. 1 schematically illustrates the structure of a conventional insulated gate bipolar transistor of the prior art. A conventional trench punch-through IGBT includes a metal oxide semiconductor (or called MOS) layer 11, a N-type buffer layer 12 and a P-type injection layer 13. The MOS layer 11 is disposed between an emitter metal layer 111 and a N-type drift layer 112 for providing electron injection and controlling element switching. The N-type buffer layer 12 is used for conducting between the electrons and the electron holes and withstanding high voltage. In addition, the N-type buffer layer 12 is used for buffering the electric field and adjusting the concentration of the electron hole injection, and the P-type injection layer 13 is used for providing electron hole injection, among which the P-type injection layer 13 is a high-concentration P-type substrate. As to the MOS layer 11, the carrier concentration must be increased whenever the turn-on voltage needs to be decreased. However, the amount of channel and the current density can only be increased to provide more injection electrons for the structure of the conventional IGBT.

On the other hand, because the N-type buffer layer 12 and the N-type drift layer 112 are fabricated through epitaxy in the processes of manufacturing the conventional IGBT 1, the total substrate cost is relatively higher and the characteristics of elements are not easy to be adjusted. Moreover, the carrier concentration of the collector metal layer 131 of the P-type injection 13 is relatively higher, so that the carriers are not easy to disappear when the element is turn-off. In other words, the extra carrier lifetime killing process is utilized to reduce the energy losses during the on-off operation, and the fabricating time and cost are simultaneously increased.

There is a need of providing a power semiconductor and a manufacturing method thereof to obviate the drawbacks encountered from the prior art.

SUMMARY OF THE INVENTION

The present invention provides a power semiconductor and a manufacturing method thereof in order to eliminate the drawbacks of the element damage caused by decreasing the turn-on voltage of a conventional IGBT, the higher total substrate cost, the unchangeable element characteristics, and the high fabricating time and cost caused by extra processes.

The present invention also provides a power semiconductor and a manufacturing method thereof. By utilizing the semiconductor substrate having drift layer and forming the N-type buffer layer and the P-type injection layer on the second surface of the semiconductor substrate through ion implanting, the ion concentration is adjustable. As a result, the electron hole injection efficiency and the width of depletion region are easily adjusted, the fabricating processes are simplified, and the fabricating time and cost are reduced.

The present invention further provides a power semiconductor and a manufacturing method thereof. Since the metal oxide semiconductor layer is specially designed, the amount of mask and the fabricating cost are reduced, the electron hole concentration of the emitter metal layer is increased, and the field effect is inhibited.

The present invention further provides a power semiconductor and a manufacturing method thereof. Via using laser beams, which are adjustable, for back surface treating and using the back surface laser anneal technology for fabricating the collector, not only the anneal energy can be controlled and the metal layer of the front surface and the element exterior of the power semiconductor are protected, but also the anneal technologies and carrier activation rates in different depths are provided. Under this circumstance, the flexibility of characteristics of the power semiconductor is enhanced and optimized.

In accordance with an aspect of the present invention, there is provided a power semiconductor. The power semiconductor includes a semiconductor substrate, a metal oxide semiconductor layer, a N-type buffer layer and a P-type injection layer. The semiconductor substrate has a first surface and a second surface. The metal oxide semiconductor layer is formed on the first surface for defining a N-type drift layer of the semiconductor substrate. The N-type buffer layer is formed on the second surface through ion implanting, and the P-type injection layer is formed on the N-type buffer layer through ion implanting.

In accordance with another aspect of the present invention, there is provided a manufacturing method of a power semiconductor. The manufacturing method includes steps of providing a semiconductor substrate, forming a metal oxide semiconductor layer on a first surface of the semiconductor substrate, forming a N-type buffer layer on a second surface of the semiconductor substrate through ion implanting, forming a P-type injection layer on the N-type buffer layer through ion implanting, and forming a collector metal layer on the P-type injection layer through metal depositing.

The above contents of the present invention will become more readily apparent to those ordinarily skilled in the art after reviewing the following detailed description and accompanying drawings, in which:

BRIEF DESCRIPTION OF THE DRAWINGS

FIG. 3A to FIG. 3F schematically illustrate the structures corresponding to the steps of a manufacturing method of a power semiconductor according to an embodiment of the present invention;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
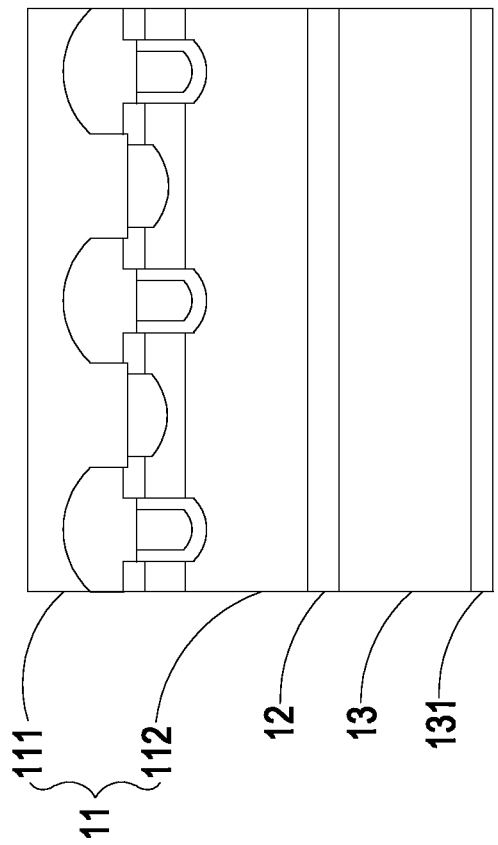
FIG. 1 schematically illustrates the structure of a conventional insulated gate bipolar transistor of the prior art.
Figures 2A, 2B:
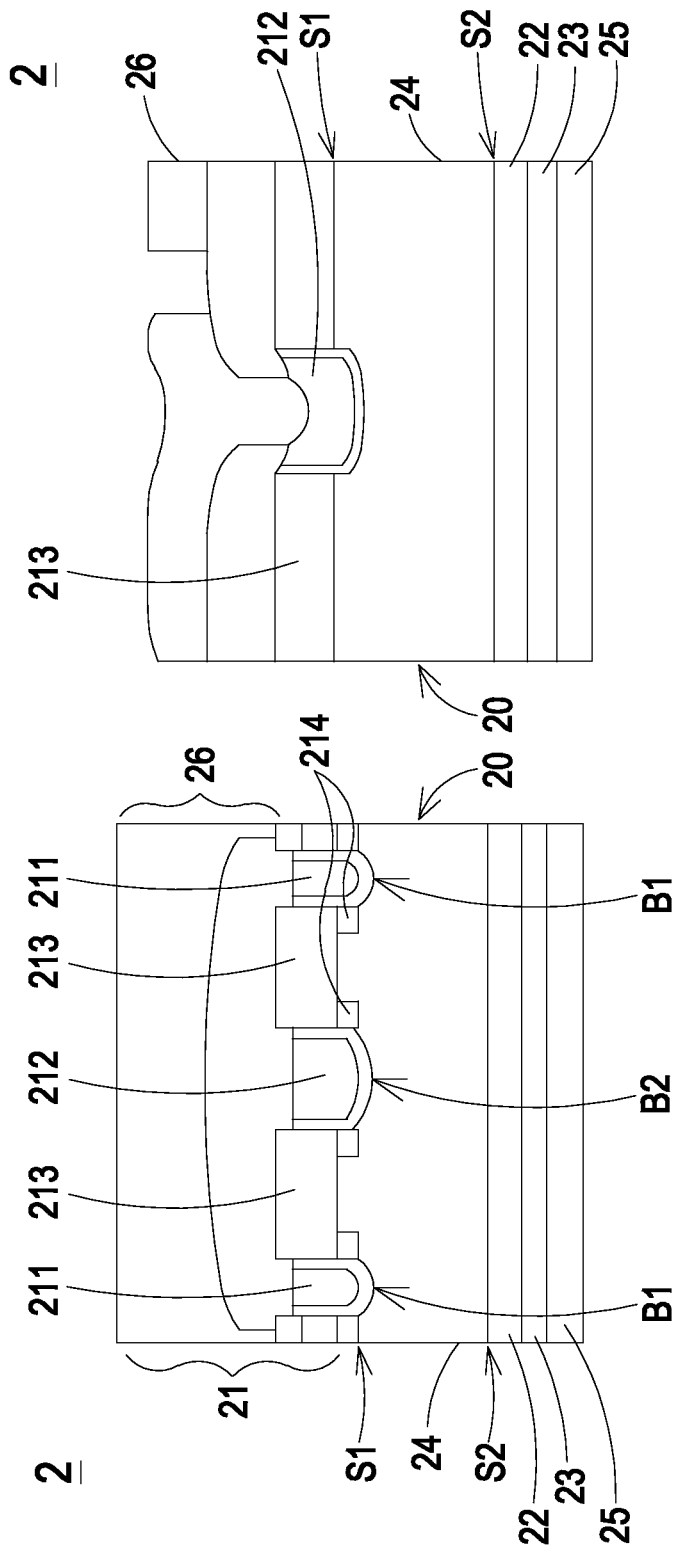
FIG. 2A schematically illustrates the main structure of a power semiconductor according to an embodiment of the present invention.
FIG. 2B schematically illustrates the edge structure of a power semiconductor according to an embodiment of the present invention.

Please refer to FIG. 2A and FIG. 2B. FIG. 2A schematically illustrates the main structure of a power semiconductor according to an embodiment of the present invention. FIG. 2B schematically illustrates the edge structure of a power semiconductor according to an embodiment of the present invention. The power semiconductor 2 of the present invention includes a semiconductor substrate 20, a metal oxide semiconductor layer 21, a N-type buffer layer 22 and a P-type injection layer 23. The semiconductor substrate 20 is not limited to a N-type floating zone substrate. The semiconductor substrate 20 has a first surface S1 and a second surface S2, among which the first surface S1 and the second surface S2 are for example the front surface and the back surface of the power semiconductor 2, but not limited thereto. The metal oxide semiconductor layer 21 is formed on the first surface S1 of the semiconductor substrate 20 for defining a N-type drift layer 24 of the semiconductor substrate 20. The N-type drift layer 24 is used for conducting between the electrons and the electron holes and withstanding high voltage. Since the N-type drift layer 24 is made by the N-type floating zone substrate as the semiconductor substrate 20, the lifetime of carrier is relatively higher and the cost is relatively lower.

In some embodiments, the N-type buffer layer 22 is formed on the second surface S2 of the semiconductor substrate 20 through ion implanting for buffering the electric field and adjusting the concentration of electron hole injection. By ion implanting N-type impurities like P31 or As75 on the second surface S2, which is for example the back surface of the power semiconductor 2, the electron hole injection efficiency and the width of the depletion region can be adjusted by changing the implant concentration, and the process flexibility is enhanced. Additionally, the P-type injection layer 23 is formed on the N-type buffer layer 22 through ion implanting for providing electron hole injection. By ion implanting P-type impurities like B11 on the second surface S2, the electron hole injection efficiency can be adjusted by changing the implant concentration. Meanwhile, because the concentration of implanted ions is relatively lower, the amount of electron hole injection is relatively lower. As a result, the thickness of the P-type injection layer 23 is reduced, so that the electrons are easy to be transmitted through the P-type injection layer 23 and absorbed by the collector metal layer 25, the speed of an on-off operation is getting faster, and the fabricating cost is reduced since the extra carrier lifetime killing process is not necessary.

On the other hand, the metal oxide semiconductor layer 21 is specially designed, so the carrier concentration of the conduction region is increased, and the turn-on saturation voltage is reduced. Please refer to FIG. 2A and FIG. 2B again. The metal oxide semiconductor layer 21 of the power semiconductor 2 includes a plurality of first trench regions 211 formed on the N-type drift layer 24 and at least one second trench region 212 formed between two adjacent first trench regions 211 and adjacent to the N-type drift layer 24, among which the width of the second trench region 212 is 1.5 to 2 times the width of each the first trench region 211, but not limited thereto. Under this circumstance, when the second trench region 212 is in contact with the gate, the amount of the mask is reduced and the fabricating cost is also reduced. In another embodiments, the second trench region 212 is in contact with a emitter metal layer 26 for forming a field plate.

In some embodiments, the metal oxide semiconductor layer 21 further includes a floating P-base region 213 formed between the first trench regions 211 and the second trench region 212. Considering the conventional power semiconductor, which has a P-base region being in contact with the emitter. The P-base region is under the reverse bias when the conventional power semiconductor is turn-on or enable, so the concentration of the electron holes nearing the emitter is low and not conductive to reduce the turn-on resistance. To solve this issue, the floating P-base region 213 is applied to the metal oxide semiconductor layer 21 of the power semiconductor 2 for reducing the area of the P-base region that is under reverse bias. As a result, the concentration of the electron holes nearing the emitter metal layer 26 is increased and enhanced for reducing the turn-on resistance.

In some embodiments, the metal oxide semiconductor layer 21 further includes a carrier enhanced region 214 formed between the floating P-base region 213 and the N-type drift layer 24 and adjacent to a first end B1 of the first trench region 211 or a second end B2 of the second trench region 212. By ion implanting N-type impurities like P31 or As 75 under the floating P-base region 213 and near the first end B1 of the first trench region 211 or the second end B2 of the second trench region 212, which is the position closer to the back surface than the floating P-base region 213, the carrier enhanced region 213 is formed for inhibiting the field effect.

Figure 3F:
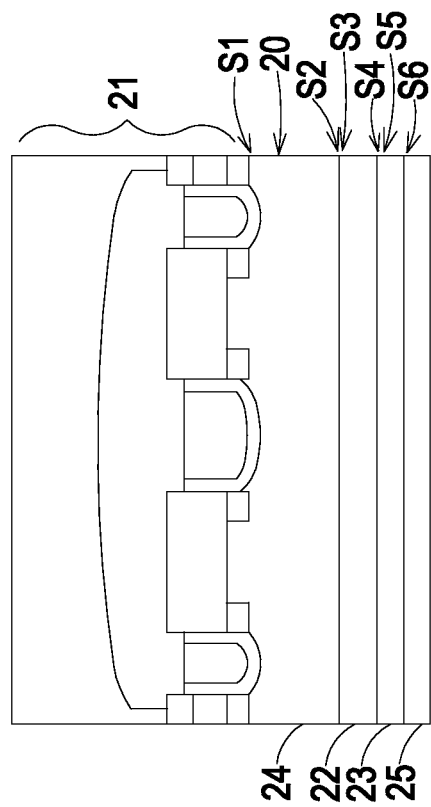
Figure 3E:
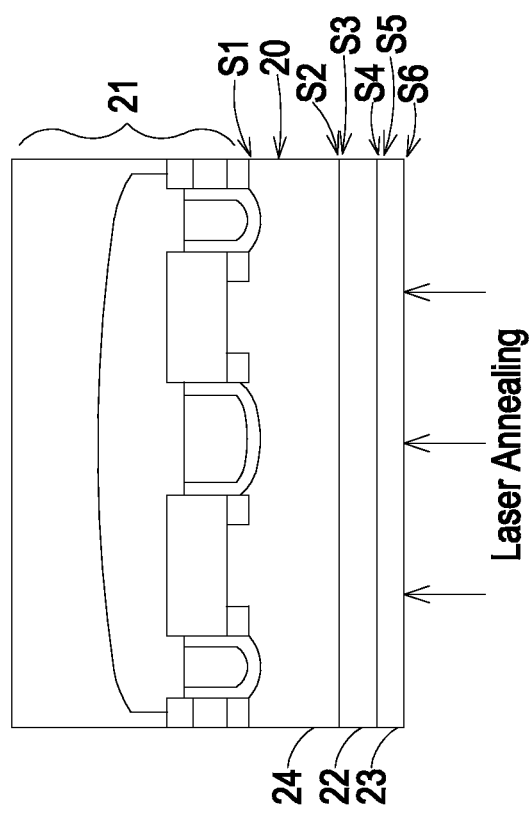
Figure 4:
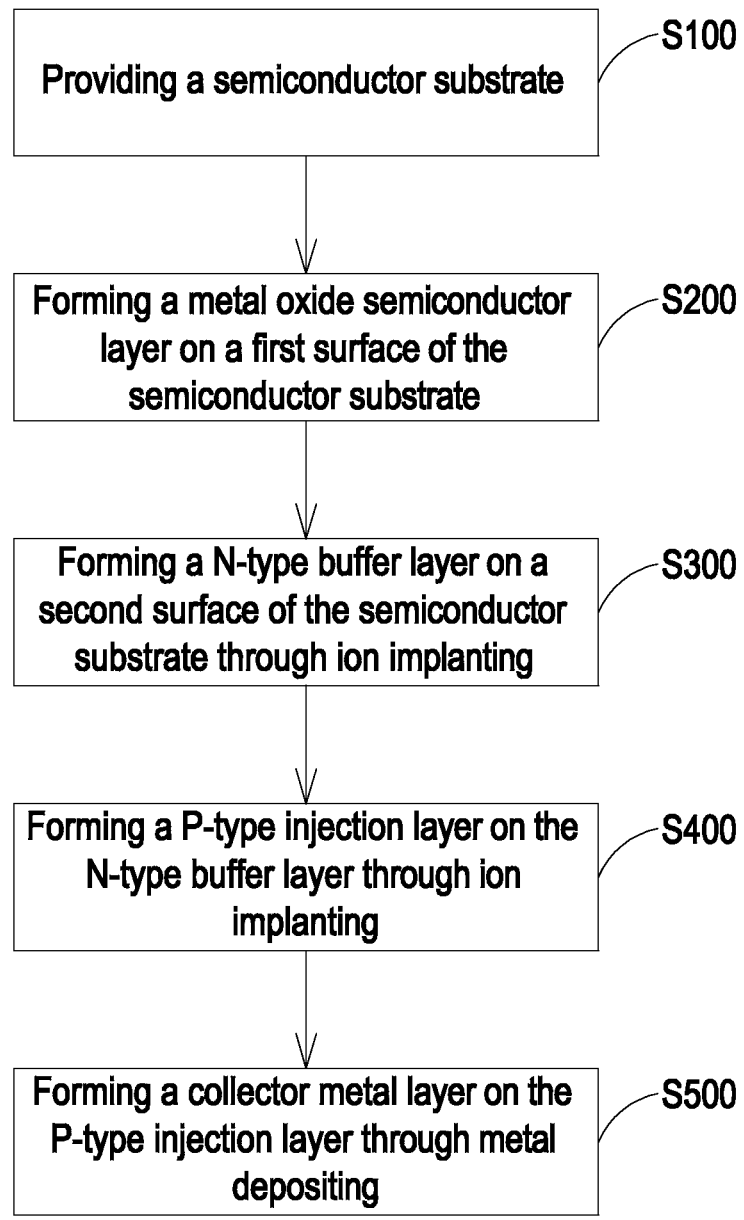
FIG. 4 schematically illustrates the flow chart of a manufacturing method of a power semiconductor according to an embodiment of the present invention.
Figure 5:
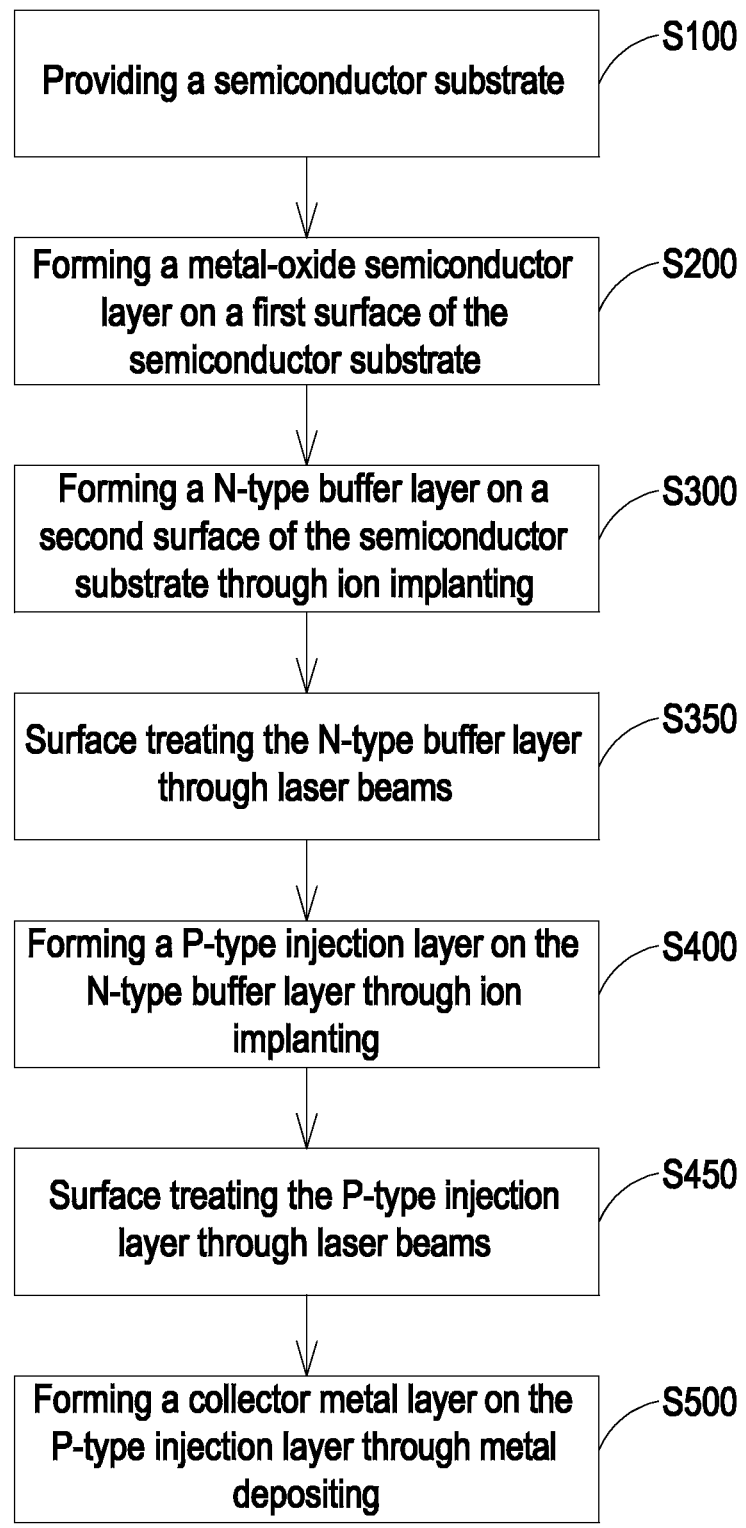
FIG. 5 schematically illustrates the flow chart of a manufacturing method of a power semiconductor according to another embodiment of the present invention.

Please refer to FIG. 3A to FIG. 3F, FIG. 4 and FIG. 5. FIG. 3A to FIG. 3F schematically illustrate the structures corresponding to the steps of a manufacturing method of a power semiconductor according to an embodiment of the present invention. FIG. 4 schematically illustrates the flow chart of a manufacturing method of a power semiconductor according to an embodiment of the present invention. FIG. 5 schematically illustrates the flow chart of a manufacturing method of a power semiconductor according to another embodiment of the present invention. The manufacturing method of the power semiconductor 2 of the present invention includes steps as following. First of all, as shown in FIG. 3A, step S100 and step S200, providing a semiconductor substrate 20, and forming a metal oxide semiconductor layer 21 on a first surface S1 of the semiconductor substrate 20. The metal oxide semiconductor layer 21 is similar with the metal oxide semiconductor layer 21 of the embodiments mentioned above, and is not redundantly described herein. It should be noted that all of the metal oxide semiconductor layers having the similar advantages and structures with metal oxide semiconductor layer 21 of the present invention are taught by the present invention. After forming the metal oxide semiconductor layer 21 on the first surface S1, which is for example a front surface of the power semiconductor 2, of the semiconductor substrate 20, a further step of grinding a second surface S2 of the semiconductor substrate 20 is proceeded (i.e. a backside grinding process).

Next, as shown in FIG. 3B, FIG. 3C and step S300, after grinding the second surface S2 of the semiconductor substrate 20, forming a N-type buffer layer 22 on the second surface S2 of the semiconductor substrate 20 through ion implanting. An example of the implanting ions includes but not limited to the N-type impurities like P31 or As75. The N-type buffer layer 22 has a third surface S3 and a fourth surface S4, among which the third surface S3 is in contact with the second surface S2 of the semiconductor substrate 20. After forming the N-type buffer layer 22, surface treating the N-buffer layer 22 through laser beams as shown in step S350. An example of step S350 is laser-annealing the N-type buffer layer 22 (i.e. a backside laser anneal process), but not limited thereto.

Then, as shown in FIG. 3D, FIG. 3E and step S400, after the laser-annealing on the N-type buffer layer 22, forming a P-type injection layer 23 on the fourth surface S4 of the N-type buffer layer 22 through ion implanting. An example of the implanting ions includes but not limited to the P-type impurities like B11. The P-type injection layer 23 has a fifth surface S5 and a sixth surface S6, among which the fifth surface S5 is in contact with the fourth surface S4 and the sixth surface S6 is opposite to the fifth surface S5. In particular, the sixth surface S6 and the fifth surface S5 are disposed on the two different sides of the P-type injection layer 23. After forming the P-type injection layer 23, surface treating the P-type injection layer 23 through laser beams as shown in step S450. An example of step S450 is laser-annealing the P-type injection layer 23 (i.e. a backside laser anneal process), but not limited thereto.

At last, as shown in FIG. 3F and step S500, after the laser-annealing on the P-type injection layer 23, forming a collector metal layer 25 on the P-type injection layer 23 through metal depositing. The collector metal layer 25 is formed on the sixth surface S6 of the P-type injection layer 23, and the collector metal layer 25 is disposed opposite to a emitter metal layer. In other words, the collector metal layer 25 is disposed on the other side of the emitter metal layer 26 in reference of the total power semiconductor 2, which means that the emitter metal layer 26 is formed opposite to the collector metal layer 25.

In brief, the laser beams are utilized by the power semiconductor and the manufacturing method thereof due to the adjustable characteristics, and the back surface laser-annealing technology is used for forming the collector metal layer, so that the anneal energy is controlled, the metal layer of the front surface and the element exterior of the power semiconductor are protected, the anneal technologies and carrier activation rates in different depths are provided, and the flexibility of characteristics of the power semiconductor is enhanced and optimized.

From the above description, the present invention provides a power semiconductor and a manufacturing method thereof. By utilizing the semiconductor substrate having drift layer and forming the N-type buffer layer and the P-type injection layer on the second surface of the semiconductor substrate through ion implanting, the ion concentration is adjustable, the electron hole injection efficiency and the width of depletion region are easily adjusted, the fabricating processes are simplified, and the fabricating time and cost are reduced. Meanwhile, since the metal oxide semiconductor layer is specially designed, the amount of mask and the fabricating cost are reduced, the electron hole concentration of the emitter metal layer is increased, and the field effect is inhibited. On the other hand, via using laser beams, which are adjustable, for back surface treating and using the back surface laser anneal technology for fabricating the collector, not only the anneal energy can be controlled and the metal layer of the front surface and the element exterior of the power semiconductor are protected, but also the anneal technologies and carrier activation rates in different depths are provided. Therefore, the flexibility of characteristics of the power semiconductor is enhanced and optimized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power semiconductor, comprising:
a semiconductor substrate having a first surface and a second surface, wherein said semiconductor substrate is a N-type floating zone substrate;
a metal oxide semiconductor layer formed on said first surface for defining a N-type drift layer of said semiconductor substrate, wherein said metal oxide semiconductor layer comprises:
 a plurality of first cell trench regions formed on said N-type drift layer; and
 at least one second cell trench region formed between two adjacent said first cell trench regions and adjacent to said N-type drift layer, wherein the width of said second cell trench region is 1.5 to 2 times the width of each said first cell trench region;
a N-type buffer layer formed on said second surface through ion implanting and laser-annealing, wherein said N-type buffer layer has a third surface and a fourth surface, and said third surface is in contact with said second surface;
a P-type injection layer formed on said N-type buffer layer through ion implanting and laser-annealing, wherein said P-type injection layer has a fifth surface and a sixth surface, said P-type injection layer is formed on said fourth surface, said fifth surface is in contact with said fourth surface, and said sixth surface is opposite to said fifth surface; and
a collector metal layer formed on said sixth surface.

2. The power semiconductor according to claim 1, wherein said metal oxide semiconductor layer further comprises a floating P-base region formed between said first cell trench regions and said second cell trench region.

3. The power semiconductor according to claim 2, wherein said metal oxide semiconductor layer further comprises a carrier enhanced region formed between said floating P-base region and said N-type drift layer and adjacent to a first end of said first cell trench region or a second end of said second cell trench region.

4. The power semiconductor according to claim 1 further comprising an emitter metal layer formed opposite to said collector metal layer.

5. A manufacturing method of a power semiconductor, comprising steps of:
  (a) providing a semiconductor substrate, wherein said semiconductor substrate is a N-type floating zone substrate;
  (b) forming a metal oxide semiconductor layer on a first surface of said semiconductor substrate for defining a N-type drift layer of said semiconductor substrate, wherein said metal oxide semiconductor layer comprises:
    a plurality of first cell trench regions formed on said N-type drift layer; and
    at least one second cell trench region formed between two adjacent said first cell trench regions and adjacent to said N-type drift layer, wherein the width of said second cell trench region is 1.5 to 2 times the width of each said first cell trench region;
  (c) forming a N-type buffer layer on a second surface of said semiconductor substrate through ion implanting, wherein said N-type buffer layer has a third surface and a fourth surface, and said third surface is in contact with said second surface;
  (d) forming a P-type injection layer on said fourth surface of said N-type buffer layer through ion implanting, wherein said P-type injection layer has a fifth surface and a sixth surface, said fifth surface is in contact with said fourth surface, and said sixth surface is opposite to said fifth surface;
  (e) forming a collector metal layer on said sixth surface of said P-type injection layer through metal depositing;
  (f) laser-annealing said N-type buffer layer through laser beams; and
  (g) leaser-annealing said P-type injection layer through laser beams,
  wherein said step (f) is performed after said step (c), and said step (g) is performed after said step (d).

* * * * *